(12) United States Patent
Sayilir et al.

(10) Patent No.: US 11,380,481 B2
(45) Date of Patent: Jul. 5, 2022

(54) RADIO TRANSMITTER WITH TRANSMIT SIGNAL STRENGTH INDICATOR AND METHOD THEREOF

(71) Applicant: Realtek Semiconductor Corp., Hsinchu (TW)

(72) Inventors: Serkan Sayilir, San Jose, CA (US); Poh-boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 413 days.

(21) Appl. No.: 16/739,165

(22) Filed: Jan. 10, 2020

(65) Prior Publication Data
US 2021/0217557 A1 Jul. 15, 2021

(51) Int. Cl.
| | |
|---|---|
| H03F 3/45 | (2006.01) |
| H01F 38/24 | (2006.01) |
| H01F 38/14 | (2006.01) |
| H04B 1/04 | (2006.01) |
| H03F 3/24 | (2006.01) |
| H03G 3/30 | (2006.01) |

(52) U.S. Cl.
CPC .............. *H01F 38/24* (2013.01); *H01F 38/14* (2013.01); *H03F 3/245* (2013.01); *H03F 3/45475* (2013.01); *H03G 3/3036* (2013.01); *H04B 1/04* (2013.01); *H01F 2038/143* (2013.01); *H03F 2200/451* (2013.01); *H04B 2001/0408* (2013.01)

(58) Field of Classification Search
CPC .... H01F 38/24; H01F 38/14; H01F 2038/143; H03F 3/245; H03F 3/45475; H03F 2200/451; H03F 2203/45526; H03F 2203/45731; H03F 3/195; H03F 3/45179; H03F 3/68; H03G 3/3036; H04B 1/04; H04B 2001/0408; H04B 2001/0491; G01R 21/08; G01R 21/133
USPC ......................................... 330/252–261, 301
See application file for complete search history.

(56) References Cited

U.S. PATENT DOCUMENTS

| | | | |
|---|---|---|---|
| 7,620,371 B2 | 11/2009 | Zolfaghar | |
| 2022/0018882 A1* | 1/2022 | Bellaouar | ........... H03F 3/45475 |

* cited by examiner

*Primary Examiner* — Hieu P Nguyen
(74) *Attorney, Agent, or Firm* — McClure, Qualey & Rodack, LLP

(57) ABSTRACT

A radio transmitter includes a power amplifier configured to receive an input voltage signal and output an output voltage signal; a transformer configured to receive the output voltage signal and output a load voltage signal to a load; a sensing inductor configured to output a sensed current signal in accordance with a magnetic coupling with the transformer; a digitally controlled phase shifter configured to receive the output voltage signal and output a phase-shifted voltage signal in accordance with a phase control code; a mixer configured to output a mixed current signal in accordance with a mixing of the sensed current signal and the phase-shifted voltage signal; and a transimpedance amplifier with of a low-pass response configured to convert the mixed current signal into a mean voltage signal.

20 Claims, 5 Drawing Sheets

RADIO TRANSMITTER WITH TRANSMIT SIGNAL STRENGTH INDICATOR AND METHOD THEREOF

BACKGROUND OF THE DISCLOSURE

Field of the Disclosure

The present disclosure generally relates to radio transmitter with transmit signal strength indicator, and more particularly to a radio transmitter and method that accurately estimates a transmit power under a variety of load conditions.

Description of Related Art

A radio transmitter comprises a power amplifier configured to output a first RF (radio frequency) signal to a local antenna, which converts the RF signal into an electromagnetic wave that can propagate in the air and received by a remote antenna, which converts the electromagnetic wave into a second RF signal that is received by a radio receiver. It is desirable that a power of electromagnetic wave is sufficiently high that the second RF signal is detectable by the radio receiver but also not too high lest the power amplifier might consume more energy than needed and the electromagnetic wave might cause a strong interference to other radio receivers nearby that are not supposed to receive the first RF signal. The power of the electromagnetic wave is approximately equal to a power of first RF signal, which depends on a power of an input signal to the power amplifier, a voltage gain of the power amplifier, and an impedance matching between the power amplifier and the local antenna. In general, the power of the first RF signal is unknown without using a TSSI (transmit signal strength indicator). The TSSI is configured to estimate a power of an output of a power amplifier.

Zolfaghari discloses a TSSI in U.S. Pat. No. 7,620,371. The TSSI disclosed therein detects an envelope of a RF signal and assumes a certain load resistance from the antenna that receives the RF signal. The assumption is no always valid and thus the method disclosed therein may not be applicable in a general application scenario.

What is desired is a method to accurately estimate a transmit power under various load conditions.

BRIEF DESCRIPTION OF THIS DISCLOSURE

In an embodiment, a radio transmitter comprises: a power amplifier configured to receive an input voltage signal and output an output voltage signal; a transformer configured to receive the output voltage signal and output a load voltage signal to a load; a sensing inductor configured to output a sensed current signal in accordance with a magnetic coupling with the transformer; a digitally controlled phase shifter configured to receive the output voltage signal and output a phase-shifted voltage signal in accordance with a phase control code; a mixer configured to output a mixed current signal in accordance with a mixing of the sensed current signal and the phase-shifted voltage signal; and a transimpedance amplifier with of a low-pass response configured to convert the mixed current signal into a mean voltage signal.

In an embodiment, a method comprises: receiving an input voltage signal; converting the input voltage signal into an output voltage signal using a power amplifier; transforming the output voltage signal into a load voltage signal at a load using a transformer; outputting a sensed current signal using a sensing inductor in accordance with a magnetic coupling with the transformer; converting the output voltage signal into a phase-shifted voltage signal in accordance with a phase control code using a digitally control phase shifter; mixing the sensed current signal with the phase-shifted voltage signal into a mixed current signal using a mixer; converting the mixed current signal into a mean voltage signal using a transimpedance amplifier with a low-pass response; and obtaining an estimate of a power delivered into the load by multiplying a value of the mean voltage signal with a power scaling factor.

DETAILED DESCRIPTION OF THIS DISCLOSURE

The present disclosure is directed to radio transmitter and transmit signal strength indicator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "power," "CMOS (complementary metal oxide semiconductor)," "impedance," "inductor," "magnetic coupling," "resistor," "capacitor," "resistance," "capacitance," "resistive impedance," "operational amplifier," "power amplifier," "transimpedance amplifier," "mixer (or frequency mixer)," "transformer," "load," "frequency," "phase," "phase shift," "differential signal," and "negative feedback." Terms like these are used in a context of microelectronics, and the associated concepts are apparent to those of ordinary skills in the art and thus will not be explained in detail here.

Persons of ordinary skills in the art understand basic trigonometry and do not need an explanation of, for instance, $$\cos(A)\cos(B) = \frac{1}{2}[\cos(A+B) + \cos(A-B)],$$

and a time average of a periodic sinusoidal signal is zero.

Throughout this disclosure, a "signal" is either a voltage or a current carrying a certain information.

Throughout this disclosure, a differential signaling scheme is used extensively. A differential voltage signal comprises two single-ended voltage signals denoted with suffixes "+" and "−," respectively, attached in subscript, and a value of the differential voltage signal is represented by a difference between said two single-ended voltages. For instance, $V_I$ ($V_O$, $V_S$, $V_M$) comprises $V_{I+}$ ($V_{O+}$, $V_{S+}$, $V_{M+}$) and $V_{I-}$ ($V_{O-}$, $V_{S-}$, $V_{M-}$) and a value of $V_I$ ($V_O$, $V_S$, $V_M$) is represented by a difference between $V_{I+}$ ($V_{O+}$, $V_{S+}$, $V_{M+}$) and $V_{I-}$ ($V_{O-}$, $V_{S-}$, $V_{M-}$). Likewise, a differential current signal comprises two currents denoted with suffixes "+" and "−," respectively, attached in subscript. For instance, $I_S$ ($I_M$) comprises $I_{S+}$ ($I_{M+}$) and $I_{S-}$ ($I_{M-}$) and a value of $I_S$ ($I_M$) is represented by a difference between $I_{S+}$ ($I_{M+}$) and $I_{S-}$ ($I_{M-}$).

This present disclosure is described in an engineering sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

Figure 1:
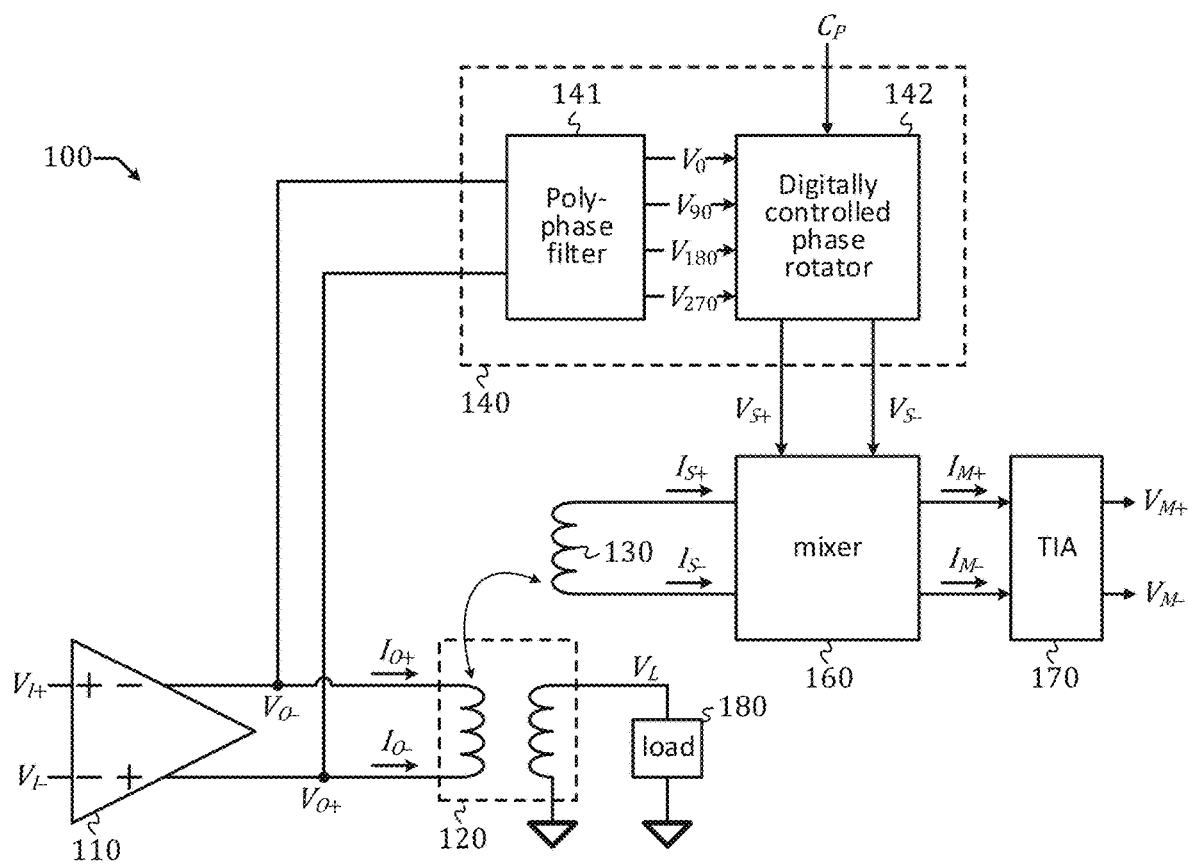
FIG. 1 shows a functional block diagram of a transmitter in accordance with an embodiment of the present disclosure.

A functional block diagram of a transmitter 100 in accordance with an embodiment of the present disclosure is shown in FIG. 1. Transmitter 100 comprises: a power amplifier 110 configured to receive an input voltage signal $V_I$ (comprising $V_{I+}$ and $V_{I-}$) and output an output voltage signal $V_O$ (comprising $V_{O+}$ and $V_{O-}$); a transformer 120 configured to receive the output voltage signal $V_O$ and output a load voltage signal $V_L$ to a load 180; a digitally controlled phase shifter 140 configured to receive the output voltage signal $V_O$ and output a phase-shifted voltage signal $V_S$ (comprising $V_{S+}$ and $V_{S-}$) in accordance with a phase control code $C_P$; a current-sensing inductor 130 configured to output a sensed current signal $I_S$ (comprising $I_{S+}$ and $I_{S-}$) in accordance with a magnetic coupling with the transformer 120; a mixer 160 configured to receive the phase-shifted voltage signal $V_S$ and the sensed current signal $I_S$ and output a mixed current signal $I_M$ (comprising $I_{M+}$ and $I_{M-}$); and a TIA (transimpedance amplifier) 170 of a low-pass response configured to receive the mixed current signal $I_M$ and output a mean voltage signal $V_M$ (comprising $V_{M+}$ and $V_{M-}$).

The output voltage signal $V_O$ can be modeled by the following equation:

$$V_O = A_O \cos(\omega t), \tag{1}$$

where, $A_O$ denotes an amplitude of the output voltage signal $V_O$, $\omega$ denotes an angular frequency, and t denotes a time variable.

Along with the output voltage signal $V_O$, an output current signal $I_O$ is also received by the transformer 120. The output current signal $I_O$ can be modeled by the following equation:

$$I_O = B_O \cos(\omega t - \theta_1), \tag{2}$$

where, $B_O$ denotes an amplitude of the output current signal $I_O$, and $\theta_1$ denotes a phase delay between $V_O$ and $I_O$. Assume the transformer 120 introduces a loss factor $G_0$. Then, a power $P_L$ delivered to the load 180 is equal to an average of a product of the output voltage signal $V_O$ and the output current signal $I_O$ times the loss factor $G_0$, i.e.

$$P_L = G_0 <V_O I_O> \tag{3}$$

Here, $<\cdot>$ denotes a time-averaging function. Substituting equations (1) and (2) into equation (3), we can obtain:

$$P_L = \frac{G_0 A_O B_O \cos(\theta_1)}{2}. \tag{4}$$

Note that $V_O I_O$ contains a time-varying term pertaining to $\cos(2\omega t - \theta_1)$ that vanishes after time-averaging.

The sensing inductor 130 performs a sensing function so that the sensed current signal $I_S$ is proportional to the output current signal $I_O$ with a phase delay. Mathematically, that can be modeled by the following equation:

$$I_S = B_O G_1 \cos(\omega t - \theta_1 - \theta_2), \tag{5}$$

where, $G_1$ and $\theta_2$ denote a proportional constant and a phase delay, respectively, pertaining to the magnetic coupling between the sensing inductor 130 and the transformer 120.

The digitally controlled phase shifter 140 performs a phase shifting function so that the shifted voltage signal $V_S$ is proportional to the output voltage signal $V_O$ with a phase shift controlled by the phase control code $C_P$. Mathematically, that can be modeled by the following equation:

$$V_S = A_O G_2 \cos(\omega t - \theta_3), \tag{6}$$

where, $G_2$ and $\theta_3$ denote a proportional constant and a phase shift, respectively, pertaining to the digitally controlled phase shifter 140.

Mixer 160 performs a multiplication function that can be modeled by the following equation $$I_M = G_3 V_S I_S, \tag{7}$$

where, $G_3$ denotes a gain factor of the mixer 160.

TIA 170 performs a time-averaging function that can modeled by the following equation:

$$V_M = G_4 <I_M>, \tag{8}$$

where, $G_4$ denotes a gain factor of the TIA 170.

From equations (5), (6), (7), and (8), we can obtain $$V_M = G_3 G_4 <B_O G_1 \cos(\omega t - \theta_1 - \theta_2) A_O G_2 \cos(\omega t - \theta_3)>, \tag{9}$$

which can be simplified to $$V_M = \frac{A_O B_O G_1 G_2 G_3 G_4 \cos(\theta_1 + \theta_2 - \theta_3)}{2} \tag{10}$$

From equations (4) and (10), we obtain $$P_L = G V_M \tag{11}$$

where $$G \equiv \frac{G_0}{G_1 G_2 G_3 G_4}$$

is a power scaling factor, provided $\theta_2 = \theta_3$, i.e. a phase shift amount of the digitally controlled phase shifter 140 equals a phase delay of the sensing inductor 130. In other words, $V_M$ times the power scaling factor G is equal to $P_L$, provided $\theta_2 = \theta_3$.

The phase control code $C_P$ is set such that the condition $\theta_2 = \theta_3$ is met. During an initial calibration, a proper setting of $C_P$ that leads to the condition $\theta_2 = \theta_3$ is found, and so is the scaling factor G. Then, $G \cdot V_M$ is an accurate estimate of the power delivered to the load 180.

Power amplifiers are well known in the prior art. The power amplifier 110 of FIG. 1 can be embodied using whatever circuit known at a discretion of circuit designer.

Figure 2:
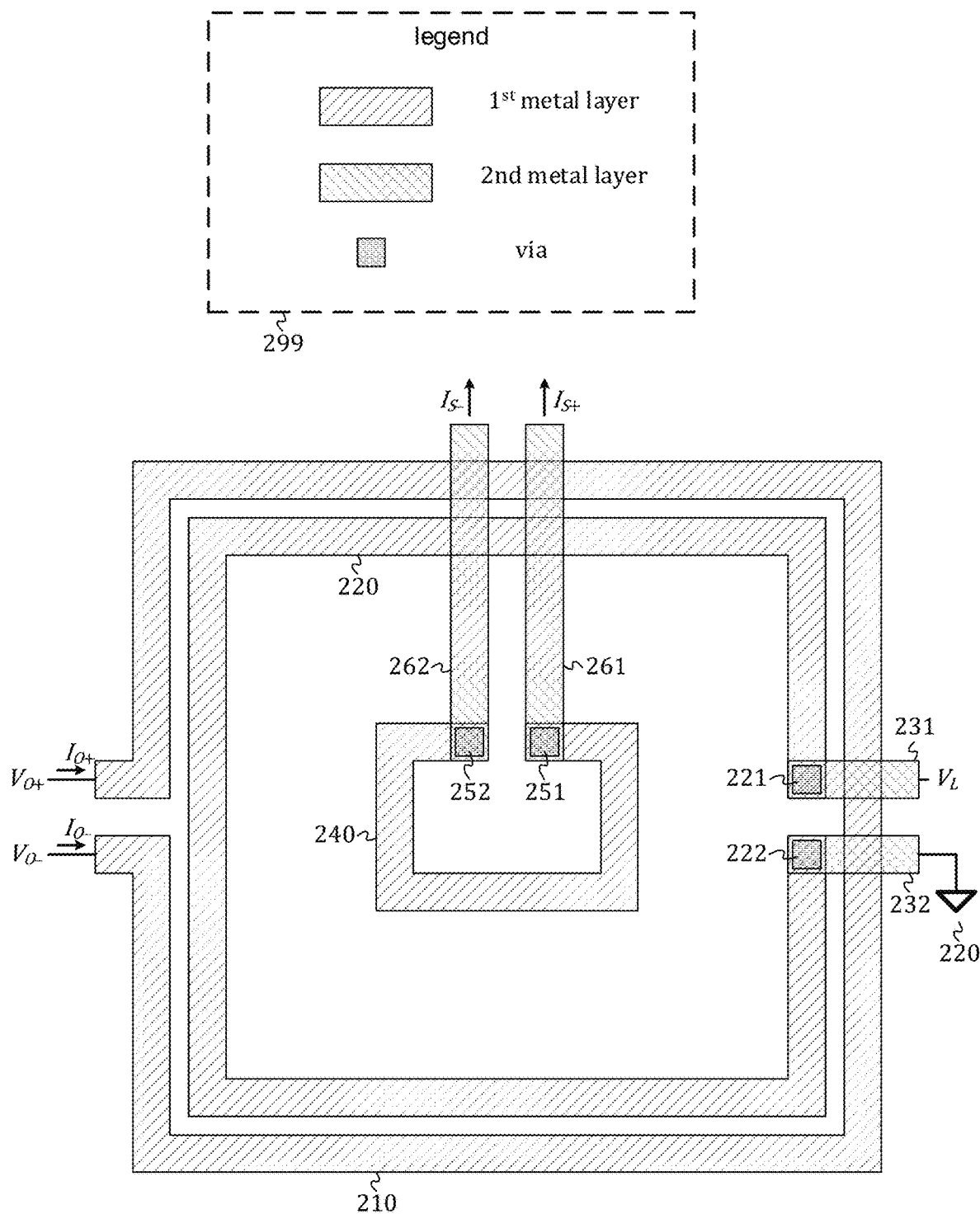
FIG. 2 shows a top view of a layout of a transformer and a sensing inductor in accordance with an embodiment of the present disclosure.
Figure 3:
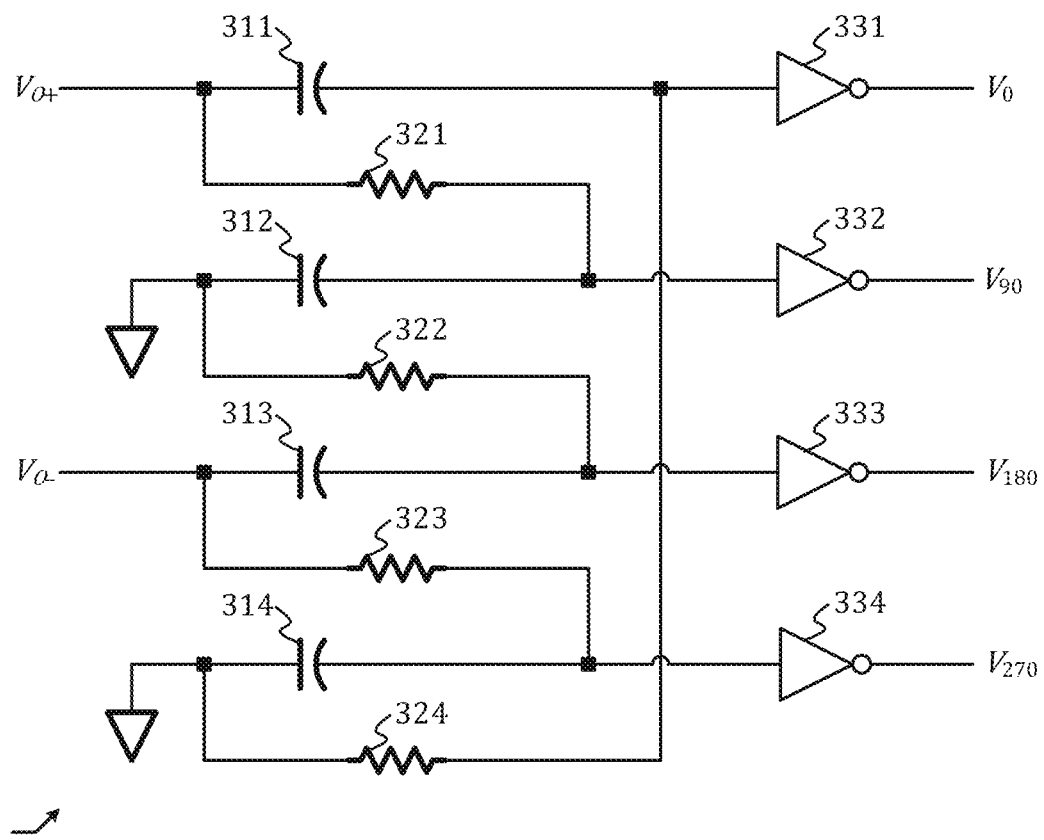
FIG. 3 shows a schematic diagram of poly-phase filter.

In an embodiment, transmitter 100 is embodied by an integrated circuit fabricated on a silicon substrate using a CMOS (complementary metal oxide semiconductor) process with a multi-layer structure including a first metal layer, a second metal layer, and a via layer configured to allow an electrical connection between a first metal on the first metal layer and a second metal on a second metal layer. A top view of a layout of the transformer 120 and the sensing inductor 130 in accordance with an embodiment of the present disclosure is shown in FIG. 2. A legend is shown in box 299. The transformer 120 comprising metal traces 210 and 220 laid out on the first metal layer, metal traces 231 and 232 laid out on the second metal layer, and vias 221 and 222 laid out on the via layer. Metal trace 210 form a first loop and embodies a primary coil of the transformer 120 for receiving the output voltage signal $V_O$ and the output current signal $I_O$. Metal trace 231, via 221, metal trace 220, via 222, and metal trace 232 are linked sequentially and collectively form a second loop and embodies a secondary coil of the transformer 120 for outputting the load voltage signal $V_L$. The sensing inductor 130 comprises metal traces 240 laid out on the first metal layer, metal traces 261 and 262 laid out on the second metal layer, and vias 251 and 252 laid out on the via layer. Metal trace 261, via 251, metal trace 240, via 252, and metal trace 262 are linked sequentially and collectively to form a third loop that has an appreciable magnetic coupling to the first loop.

The digitally controlled phase shifter 140 comprises a poly-phase filter 141 configured to receive the output voltage signal $V_O$ and output a four-phase voltage signal comprising a 0-degree phase $V_0$, a 90-degree phase $V_{90}$, a 180-degree phase $V_{180}$, and a 270-degree phase $V_{270}$, and a digitally controlled phase rotator 142 configured to receive the four-phase voltage signal and output the phase-shifted voltage signal $V_S$ in accordance with the phase control code $C_P$.

A poly-phase filter receives a two-phase signal and output a four-phase signal. The output voltage signal $V_O$, which in differential embodiment comprises $V_{O+}$ and $V_{O-}$, is a two-phase signal wherein $V_{O+}$ is a first phase, $V_{O-}$ is a second phase, and $V_{O+}$ and $V_{O-}$ are 180-degrees out of phase. A schematic diagram of an embodiment of the poly-phase filter 141 is shown in FIG. 2. Poly-phase filter 141 comprises: capacitors 311, 312, 313, and 314, resistors 321, 322, 323, and 324, and inverting amplifiers 331, 332, 333, and 334. Poly-phase filter 141 is well known in the prior art and thus not explained in detail here. Persons of ordinary skills in the art may also choose to cascade a plurality of poly-phase filters to achieve a higher degree of phase accuracy. In an embodiment, a gain of inverting amplifiers 331, 332, 333, and 334 is adjustable. In another embodiment, inverting amplifiers 331 and 333 are combined into a first differential amplifier (not shown in figure), while inverting amplifiers 332 and 334 are combined into a second differential amplifier (not shown in figure); this is clear to those of ordinary skills in the art and thus no figure is shown.

A digitally controlled phase rotator receives a four-phase voltage signal and output a two-phase voltage signal by means of a phase interpolation in accordance with a control code. For digitally controlled phase rotator 142, $V_0$, $V_{90}$, $V_{180}$, and $V_{270}$ embody the four-phase voltage signal, $V_{S+}$ and $V_{S-}$ embody the two-phase voltage signal, and $C_P$ embodies the control code. In an embodiment, $C_P$ is a N-bit binary code, where N is an integer greater than 2, and a phase of $V_{S+}$ is equal to one of $2^N$ phases uniformly spaced between 0-degrees and 360-degrees. In an embodiment, N is 6. A digitally controlled phase rotor that can be used to embody the digitally controlled phase rotator 142 can be found in "A Wideband CMOS Linear Digital Phase Rotor" authored by Wang and Hajimiri and published in 2007 IEEE Custom Integrated Conference, San Jose, Calif.

By using the poly-phase filter 141 followed by the digitally controlled phase rotator, $V_S$ is proportional to $V_O$ with a phase delay that can be controlled by the phase control code $C_P$.

Figure 4:
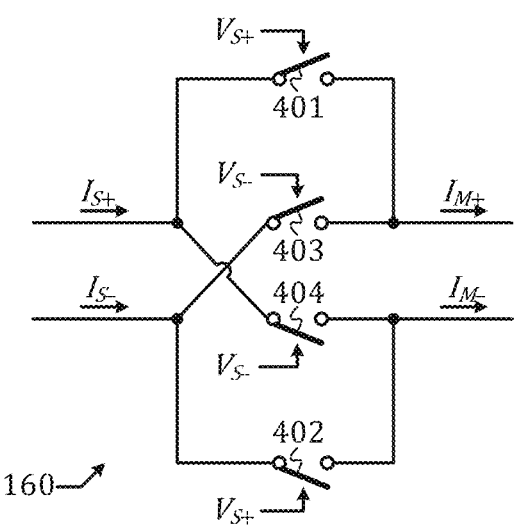
FIG. 4 shows a schematic diagram of a mixer.

A schematic diagram of an embodiment of the mixer 160 is shown in FIG. 4. Mixer 160 comprises four switches 401, 402, 403, and 404 controlled by $V_{S+}$, $V_{S+}$, $V_{S-}$, and $V_{S-}$, respectively, and configured to receive the sensed current signal $I_S$ (comprising $I_{S+}$ and $I_{S-}$) and output the mixed current signal $I_M$ (comprising $I_{M+}$ and $I_{M-}$). Mixer 160 is a double-balanced passive mixer known in the prior art that can perform a frequency mixing between a first signal ($I_S$, in this case) and a second signal ($V_S$, in this case) and generate a third signal ($I_M$, in this case) that is a product of the first signal and the second signal.

Figure 5:
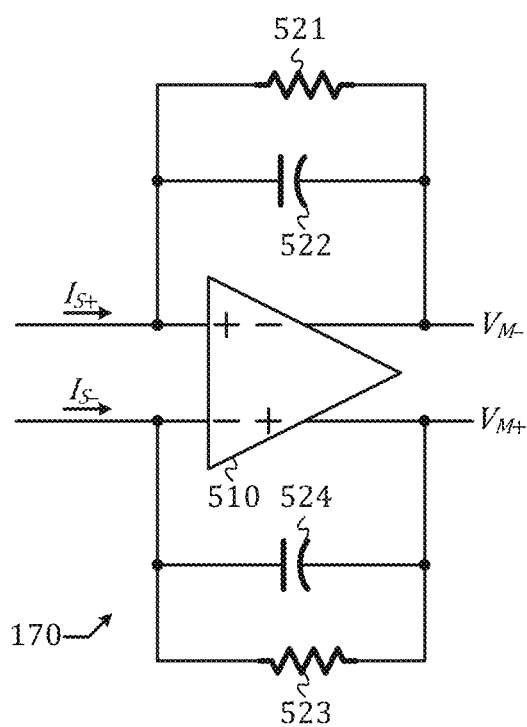
FIG. 5 shows a schematic diagram of a transimpedance amplifier with a low-pass response.

A transimpedance amplifier (TIA) converts a current signal into a voltage signal. A schematic diagram of an embodiment of TIA 170 is shown in FIG. 5. TIA 170 comprises an operational amplifier 510, two feedback resistors 521 and 523 and two feedback capacitors 522 and 524 configured in a negative feedback topology. Resistors 521 and 523 are identical, while capacitors 522 and 524 are identical. TIA 170 is a circuit well known in the prior art and thus not described in detail here. TIA 170 has a low-pass response with a corner frequency determined by a product of a resistance of resistor 521 and a capacitance of capacitor 522. The low-pass response effectively embodies a time-averaging function as needed and explained earlier.

In an embodiment, an analog-to-digital converter (not shown in figure) is used to digitize the mean voltage signal $V_M$. This way, equation (11) can be evaluated numerically.

In an embodiment, a calibration process is performed to ensure the condition $\theta_2=\theta_3$ is met. A calibration process in accordance with an embodiment of the present disclosure is stated as follows. Set the amplitude and the frequency of the input voltage signal V to a target value (for instance, the amplitude is 100 mV, the frequency is 5 GHz). Use a power measuring instrument (for instance a power meter) of a purely resistive impedance (for instance, 50-Ohm) as a load (i.e. replacing the load 180 with the power measuring instrument). Read the power shown by the power measurement instrument. Sweep all the settings of the phase control code $C_P$ and identify a setting that leads to a largest value of $V_M$. Find the power scaling factor G by calculating the ratio between the reading of the power from the power measuring instrument and the largest value of $V_M$. The setting of the phase control code $C_P$ that leads to the largest value of $V_M$ and the power scaling factor G are recorded. This concludes the calibration at said target value of the input voltage signal $V_I$. Note that with a load of purely resistive impedance (such as the power measuring instrument), the output voltage signal $V_O$ and the output current signal $I_O$ are in phase (i.e. $\theta_1=0$), and the largest value of $V_M$ occurs when $\theta_3$ equals $\theta_2$, per equation (10). Therefore, the setting of the phase control code $C_P$ that leads to the largest value of $V_M$ leads to the condition of $\theta_2=\theta_3$, which is the proper setting we need for using equation (11). Then, we can place any circuit as load 180, and use the value of $V_M$ times the power scaling factor G to find the power delivered to the circuit per equation (11).

In an embodiment, the calibration is performed at a plurality of frequencies (for instance, 5 GHz, 5.4 GHz, and 5.8 GHz). At each frequency, the calibration is performed at a plurality of amplitudes (for instance, 10 mV and 100 mV). For each combination of frequency and amplitude, the setting of $C_P$ that leads to the largest value of $V_M$ and the power scaling factor G are found and recorded. This way, a look up table can be established. When using the look up table, an entry that is closest to the amplitude and frequency of the input voltage signal V is used. For instance, if the amplitude is 80 mV and the frequency is 5.13 GHz, the entry pertaining to amplitude of 100 mV and frequency of 5 GHz in the lookup table will be used (because 80 mV is closer to 100 mV than to 10 mV, while 5.13 GHz is closer to 5 GHz than to 5.4 GHz and to 5.8 GHz). In an embodiment, a gain of inverting amplifiers 331, 332, 333, and 334 is adjusted in accordance with the amplitude of the input voltage signal V to be calibrated: the gain is adjusted to be higher for a lower amplitude of the input voltage signal $V_I$. This way, an impairment due to a noise in the mixer 160 and the TIA 170 can be mitigated.

Figure 6:
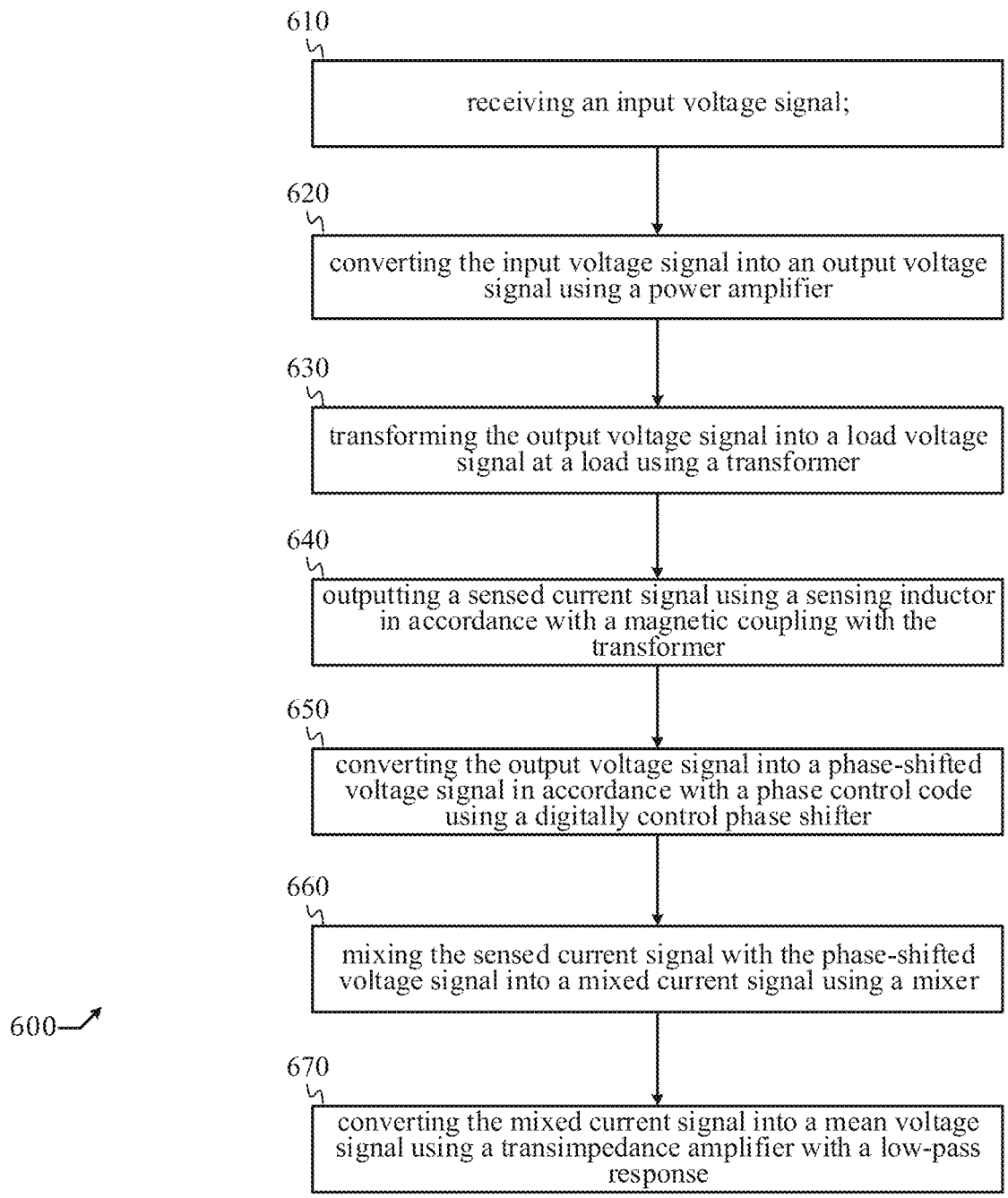
FIG. 6 shows a flow diagram of a method in accordance with an embodiment of the present disclosure.

As illustrated by a flow diagram shown in FIG. 6, a method in accordance with an embodiment of the present disclosure comprises: (step 610) receiving an input voltage signal; (step 620) converting the input voltage signal into an output voltage signal using a power amplifier; (step 630) transforming the output voltage signal into a load voltage signal at a load using a transformer; (step 640) outputting a sensed current signal using a sensing inductor in accordance with a magnetic coupling with the transformer; (step 650) converting the output voltage signal into a phase-shifted voltage signal in accordance with a phase control code using a digitally control phase shifter; (step 660) mixing the sensed current signal with the phase-shifted voltage signal into a mixed current signal using a mixer; and (step 670) converting the mixed current signal into a mean voltage signal using a transimpedance amplifier with a low-pass response.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A radio transmitter comprising:
   a power amplifier configured to receive an input voltage signal and output an output voltage signal;
   a transformer configured to receive the output voltage signal and output a load voltage signal to a load;
   a sensing inductor configured to output a sensed current signal in accordance with a magnetic coupling with the transformer;
   a digitally controlled phase shifter configured to receive the output voltage signal and output a phase-shifted voltage signal in accordance with a phase control code;
   a mixer configured to output a mixed current signal in accordance with a mixing of the sensed current signal and the phase-shifted voltage signal; and
   a transimpedance amplifier with of a low-pass response configured to convert the mixed current signal into a mean voltage.

2. The radio transmitter of claim 1, wherein the digital control phase shifter comprises a poly-phase filter configured to receive the output voltage signal and output a four-phase voltage signal, and a digitally controlled phase rotator configured to receive the four-phase voltage signal and output the phase-shifted voltage signal in accordance with the phase control code.

3. The radio transmitter of claim 1, wherein the mixer is a double-balanced passive mixer.

4. The radio transmitter of claim 1, wherein in the transimpedance amplifier comprises an operational amplifier configured in a negative feedback topology using a feedback network comprising a parallel combination of a resistor and a capacitor.

5. The radio transmitter of claim 1, wherein the phase control code is set such that a phase delay between an output current signal output from the power amplifier into the transformer and the sensed current signal is approximately equal to a phase delay between the output voltage signal and the phase-shifted voltage signal.

6. The radio transmitter of claim 5, wherein the mean voltage signal multiplied by a power scaling factor is approximately equal to a power delivered to the load.

7. The radio transmitter of claim 6, wherein the phase control code that leads to the phase delay between the output current signal and the sensed current signal being approximately equal to the phase delay between the output voltage signal and the phase-shifted voltage signal is found using a calibration.

8. The radio transmitter of claim 7, wherein the calibration is done by using a power measuring instrument as the load.

9. The radio transmitter of claim 8, wherein the phase control code that leads to the phase delay between the output current signal and the sensed current signal being approximately equal to the phase delay between the output voltage signal and the phase-shifted voltage signal is found by identifying the setting that leads to a largest mean voltage signal.

10. The radio transmitter of claim 9, wherein the power scaling factor is found by calculating a ratio between a reading of the power measuring instrument and a value of the mean voltage signal.

11. A method comprising
    receiving an input voltage signal;
    converting the input voltage signal into an output voltage signal using a power amplifier;
    transforming the output voltage signal into a load voltage signal at a load using a transformer;
    outputting a sensed current signal using a sensing inductor in accordance with a magnetic coupling with the transformer; converting the output voltage signal into a phase-shifted voltage signal in accordance with a phase control code using a digitally control phase shifter;
    mixing the sensed current signal with the phase-shifted voltage signal into a mixed current signal using a mixer;
    and converting the mixed current signal into a mean voltage signal using a transimpedance amplifier with a low-pass response.

12. The method of claim 11, wherein the digital control phase shifter comprises a poly-phase filter configured to receive the output voltage signal and output a four-phase voltage signal, and a digitally controlled phase rotator configured to receive the four-phase voltage signal and output the phase-shifted voltage signal in accordance with the phase control code.

13. The method of claim 11, wherein the mixer is a double-balanced passive mixer.

14. The method of claim 11, wherein in the transimpedance amplifier comprises an operational amplifier configured in a negative feedback topology using a feedback network comprising a parallel combination of a resistor and a capacitor.

15. The method of claim 11, wherein the phase control code is set such that a phase delay between an output current signal output from the power amplifier into the transformer and the sensed current signal is approximately equal to a phase delay between the output voltage signal and the phase-shifted voltage signal.

16. The method of claim 15, wherein the mean voltage signal multiplied by a power scaling factor is approximately equal to a power delivered to the load.

17. The method of claim 16, wherein the phase control code that leads to the phase delay between the output current signal and the sensed current signal being approximately equal to the phase delay between the output voltage signal and the phase-shifted voltage signal is found using a calibration.

18. The method of claim 17, wherein the calibration is done by using a power measuring instrument as the load.

19. The method of claim 18, wherein the phase control code that leads to the phase delay between the output current signal and the sensed current signal being approximately equal to the phase delay between the output voltage signal and the phase-shifted voltage signal is found by identifying the setting that leads to a largest mean voltage signal.

20. The method of claim 19, wherein the power scaling factor is found by calculating a ratio between a reading of the power measuring instrument and a value of the mean voltage signal.

\* \* \* \* \*